US008758985B2

(12) United States Patent
Lee et al.

(10) Patent No.: US 8,758,985 B2
(45) Date of Patent: Jun. 24, 2014

(54) METHOD OF FABRICATING NANOSTRUCTURE ARRAY AND DEVICE INCLUDING NANOSTRUCTURE ARRAY

(75) Inventors: Kyeong Seok Lee, Seoul (KR); Won Mok Kim, Seoul (KR); In Ho Kim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 13/198,892

(22) Filed: Aug. 5, 2011

(65) Prior Publication Data
US 2012/0258289 A1    Oct. 11, 2012

(30) Foreign Application Priority Data

Apr. 6, 2011    (KR) ................... 10-2011-0031602

(51) Int. Cl.
*G03F 7/26*    (2006.01)
(52) U.S. Cl.
USPC .......................................... 430/315; 430/311
(58) Field of Classification Search
USPC ................................... 430/320, 319, 311, 325
See application file for complete search history.

(56) References Cited

U.S. PATENT DOCUMENTS

| 5,120,622 A * | 6/1992 | Hanrahan ..................... 430/7 |
| 5,669,800 A | 9/1997 | Ida et al. |
| 2008/0297887 A1 * | 12/2008 | Yoshihara .................. 359/361 |
| 2010/0080954 A1 | 4/2010 | Mohseni |
| 2010/0271840 A1 * | 10/2010 | Hamada et al. .............. 362/606 |

FOREIGN PATENT DOCUMENTS

KR    1019940015680 A    7/1994

OTHER PUBLICATIONS

KIPO Office Action issued Feb. 25, 2013; Appln. No. 10-2011-0031602.

* cited by examiner

*Primary Examiner* — Cynthia Kelly
*Assistant Examiner* — Caleen Sullivan
(74) *Attorney, Agent, or Firm* — Ladas & Parry LLP

(57) ABSTRACT

Provided are a method of fabricating a nanostructure array and a device including the nanostructure array. Nanoscale patterning is caused at an interface of a resist layer by light passed through a focusing layer. By such nanoscale patterning, a nanostructure array is fabricated on a substrate in various ways. As the focusing layer, an array of beads or lenses is used, and a pattern of the resist layer may include a nanoscale pore-opening and an undercut structure connected to a lower portion of the opening. The method facilitates adjustment of the size and shape of nanostructures and the interval between the nanostructures. Also, performance of the device including the nanostructure array can be improved. In particular, the method and device result in a sensor having improved sensitivity and reliability optimized for an environment and purpose to be used.

10 Claims, 20 Drawing Sheets t

METHOD OF FABRICATING NANOSTRUCTURE ARRAY AND DEVICE INCLUDING NANOSTRUCTURE ARRAY

CROSS-REFERENCE TO RELATED APPLICATION

This application claims priority to and the benefit of Korean Patent Application No. 2011-0031602, filed on Apr. 6, 2011, the disclosure of which is incorporated herein by reference in its entirety.

BACKGROUND

1. Field of the Invention

The present invention relates to a method of fabricating a nanostructure array and a device including the nanostructure array and, more particularly, to a method of readily adjusting the size and shape of nanostructures and an interval between the nanostructures during a process of forming a nanostructure array and various devices having the nanostructure array.

2. Discussion of Related Art

With the development of application technology using nanoscale fine structures, much research is being carried out to effectively fabricate a nanoscale fine structure. However, it is still very difficult to precisely adjust the size and shape of a nanostructure, and many problems should be solved.

Nanosphere lithography technology involves depositing polystyrene nanospheres (a diameter of tens of nanometers to several micrometers) on a substrate to form a periodic particle array (PPA), depositing a metal film such as gold, silver or copper on the PPA, and removing the PPA in acetone with ultrasonic waves, thereby fabricating a metal nanoparticle array.

However, the method causes particles to be lumped together under a condition in which a particle interaction occurs due to dependency on the diameter of the nanospheres used as a mask, and has difficulty in finely adjusting the size of the particles and the interval between the particles. Particularly, in a nanostructure formed in the above method, the size and interval are correlated, and thus it is hard to independently control the size and interval.

To solve this problem, U.S. Laid-Open Patent Publication No. 2010/0080954 discloses photolithography technology that involves passing light through nanospheres two-dimensionally arranged on a photoresist (PR) layer to focus the light through the nanospheres, and thereby patterning an underlying PR area in a sub-wavelength scale.

Also, the publication discloses a method of controlling the pattern size by adjusting the amount of the light illuminated to the nanospheres. However, when a light dose illuminated to the nanosphere is low in an actual application of the technology, the size of a pore exposed and developed in the underlying PR is reduced, but an appropriate undercut structure for a subsequent lift-off process cannot be formed because of a shallow depth of exposure. On the other hand, when a light dose illuminated to the nanospheres is high, an appropriate undercut structure for a lift-off process is clearly formed, but a small nanostructure cannot be fabricated because the sensitized pore region becomes larger.

SUMMARY OF THE INVENTION

The present invention is directed to a method of fabricating a nanostructure array in which the shape and size of nanostructures and the interval between the nanostructures can be readily adjusted.

The present invention is also directed to various devices including a nanostructure array and thus having improved performance.

According to an aspect of the present invention, there is provided a method of fabricating a nanostructure array, including: illuminating light to a laminated structure, in which a substrate, a resist layer and a focusing layer are stacked in sequence, so that the light is focused while passing through the focusing layer, causing resist to be sensitized by the focused light at an interface of the resist layer so that the resist layer is patterned, and depositing a material for forming a nanostructure array on the patterned resist layer to form the nanostructure array.

The resist layer may have a resist material layer in which a nanoscale pore is formed, and an undercut-forming layer by which an undercut structure connected to a lower portion of the pore is created.

The focusing layer may be an array of beads focusing the light.

The array of beads may be formed by self-assembly.

The array of beads may have a shape modified by physical, chemical and thermal processes.

The focusing layer may be a film containing an array of beads focusing the light.

The focusing layer may include an array of lenses focusing the light.

The array of lenses may include a lens array unit and a plate under the lens array unit.

The light illuminated to the laminated structure may be light diffused in a specific direction.

The light diffused in the specific direction may be illuminated to the resist layer having a resist material layer penetrated by a nanoscale pore and an undercut-forming layer by which an undercut structure connected to a lower portion of the pore is created.

The resist material layer may include a material exhibiting a phase-change by the concentrated light through the focusing layer.

The material for constituting the nanostructure array may be a metal, semiconductor, or dielectric materials.

According to another aspect of the present invention, there is provided a device including the nanostructure array fabricated by the above method.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

An exemplary embodiment of the present invention provides a method of fabricating a nanostructure array, including the steps of: illuminating light to a laminated structure, in which a substrate, a resist layer and a focusing layer are stacked in sequence, so that the light is focused while passing through the focusing layer; causing resist to be sensitized by the focused light at an interface of the resist layer so that the resist layer is patterned; and depositing a material for forming a nanostructure array on the patterned resist layer to form the nanostructure array.

Figure 1:
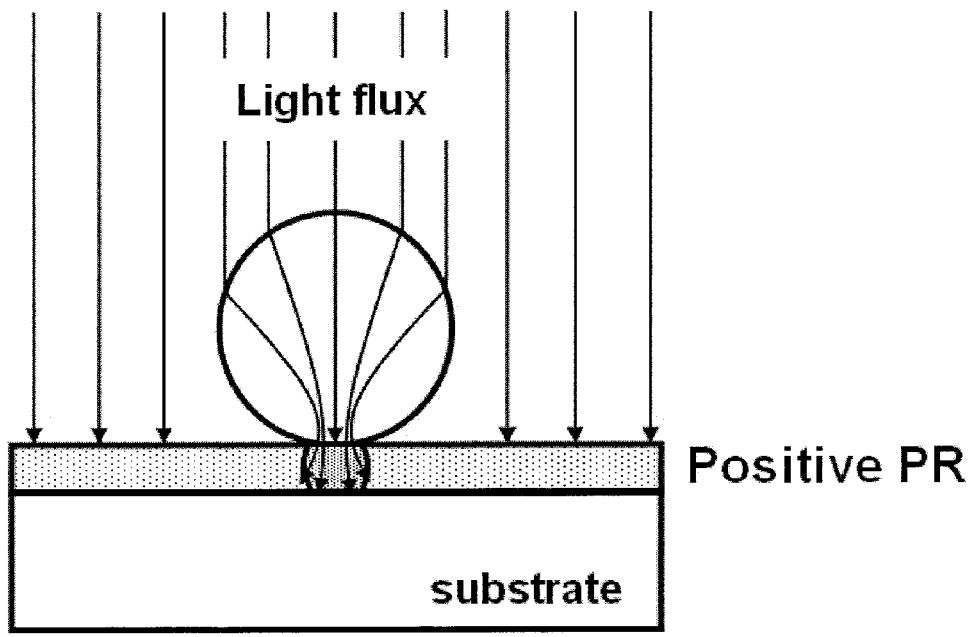
FIG. 1 illustrates focusing of illuminated light and patterning of a resist layer when a bead is used as a focusing layer.

The focusing layer functions to concentrate the illuminated light, and may have a structure in which beads or lenses are regularly arranged. In other words, the light illuminated to the laminated structure consisting of the substrate, the resist layer, and the focusing layer is focused through the beads or lenses and transfers light energy or thermal energy concentrated in a nanoscale spot to the resist layer at the interface of the resist layer underneath the focusing layer. Then, patterning of the resist layer interface is induced by the light energy or thermal energy. FIG. 1 illustrates focusing of light caused by a colloidal bead and patterning of a resist layer.

Any materials may be used as the substrate for forming the nanostructure array on it. For example, a metal, semiconductor, or dielectric material may be used.

The resist layer may be any of a positive type and a negative type. Also, both of photoresist (PR) sensitized by light energy and a material undergoing a phase-change induced by thermal energy, that is, thermal resist, may be used for the resist layer.

In the focusing layer including a regular array of beads or lenses, a material, size, shape and array structure of the beads or lenses and an interval between the beads or lenses can be diversely adjusted for use. For example, in the case of beads, an array of two-dimensionally and regularly arranged nano- to micron-scale spheres or ellipsoidal beads made of silica or polystyrene may be used. As an example of a method of forming such an array of beads, a suspension of polystyrene nanoparticles is spin- or drop-coated on a substrate, and then the solvent is dried. As another example, methods of dip-coating or Langmuir-Blodgett coating may be used in which the substrate is immersed in a suspension of colloidal beads or a heterogeneous solution having an interface with the colloid suspension and then a self-assembled monolayer of colloidal beads is transferred to a surface of the substrate during a process of removing the substrate in the vertical direction by controlling the solvent evaporation rate, solution composition, and mechanical movement.

Figure 2A:
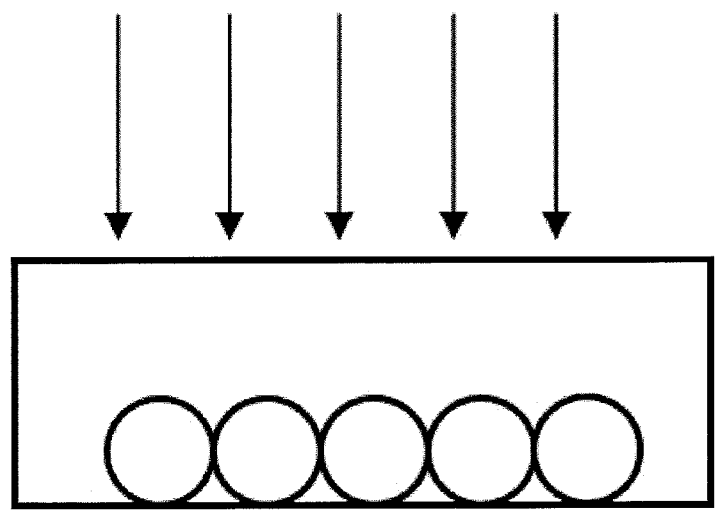
FIG. 2A illustrates an array of beads arranged in a polymer membrane and provided in the form of a film.
Figure 2B:
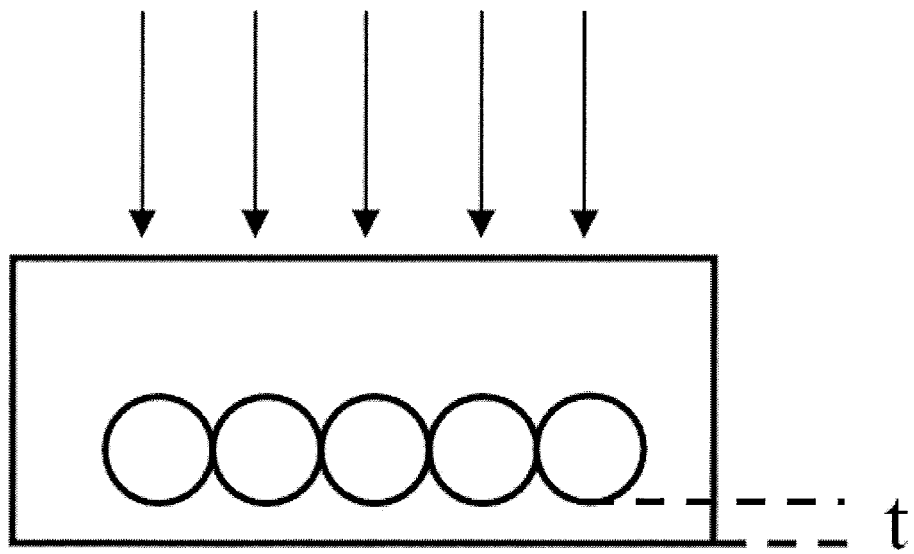
FIG. 2B illustrates an array of beads spaced a predetermined distance apart from a bottom surface of a film in consideration of an increase in focal length caused by a decrease in refractive-index difference between the beads and polymer when the array of beads provided in the form of the film is used.

Also, the beads array may be embedded in a polymer membrane. As illustrated in FIG. 2A, a bead array may be embedded in a transparent polymer film, for example, polydimethylsiloxane (PDMS). The polymer film containing a bead array can be used as the focusing layer providing advantages of being easy to use and reusable several times. However, embedding beads in a polymer film accompanies reduction of refractive-index difference between the beads and the surrounding medium, i.e. the polymer, compared to the case of bead array exposed in air. Thus, a process is required to adjust a focal point on an interface with the resist layer in consideration of the decrease in refractive-index difference. To be specific, as illustrated in FIG. 2B, the beads array is positioned a predetermined distance t apart from a bottom of a polymer film. Alternatively, beads made of a high refractive-index material, such as $Al_2O_3$ and $TiO_2$, may be used embedded in the polymer film, so that the focal length and the spot size can be reduced.

Figure 3:
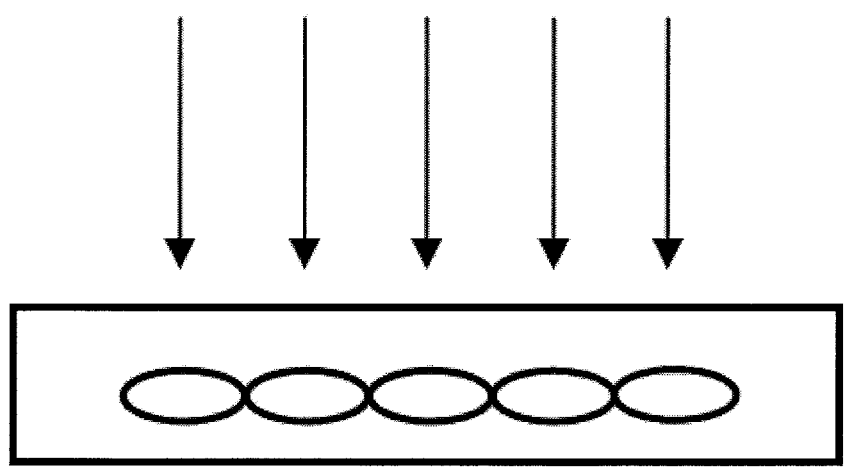
FIG. 3 illustrates an array of ellipsoidal beads formed by a hot stretching method.

In addition, the size and shape of beads can be modified in the process of forming a bead array structure through a thermal, chemical or physical treatment. As an example, the spherical polystyrene beads may be mono-dispersed in a polymer membrane solution (e.g., polyvinyl alcohol) and dried into a solid film strip. Then the film strip is heated and stretched in an oil bath above a glass transition temperature of polyvinyl alcohol, which converts the spherical beads into an array of ellipsoidal ones as illustrated in FIG. 3. The polyvinyl alcohol strip may be removed by dissolving it in an isopropanol-water mixture heated at about 85° C. after overnight soak in the solution. Since long axes of ellipsoidal polystyrene colloidal particles are aligned in a direction of an electric field, it is also possible to form a self-assembled beads array with a specific orientation on a substrate.

As another example, Au or other ions of several MeV may be irradiated to spherical polystyrene beads in order to transform them into ellipsoidal shape. In addition, when an array of polystyrene beads self-assembled on a substrate is sonicated in a toluene solution for short time, only the central portions are dissolved, so that an array of nanorings can be obtained.

Figure 4:
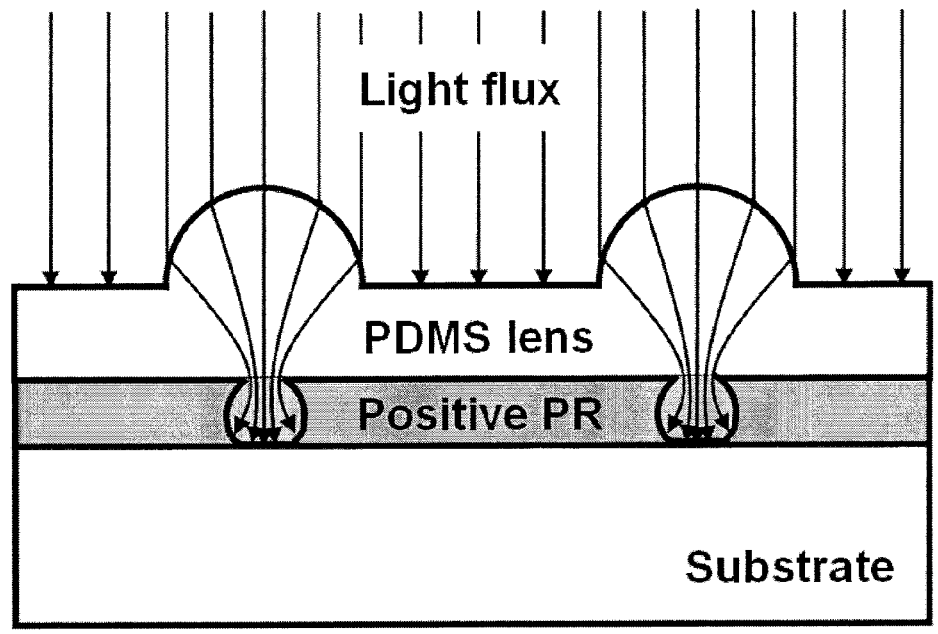
FIG. 4 illustrates focusing of illuminated light and patterning of a resist layer when lenses are used as a focusing layer.

Meanwhile, in another exemplary embodiment, the focusing layer may include a plate made of a polymer such as PDMS and lenses regularly arranged on the plate (i.e. a lens array) as shown in FIG. 4. Here, the curvature of the lenses and the thickness of the plate need to be adjusted so that the light concentrated through the lenses can be focused in nanoscale on the interface with the resist layer underneath the focusing layer. When a lens array is used as the focusing layer, it is easy to control the lens curvature, size, shape, an interval between the lenses, and array configuration during the process of manufacturing the lenses. Thus, subsequent patterning of the resist layer may also be diversely adjusted.

Figure 5:
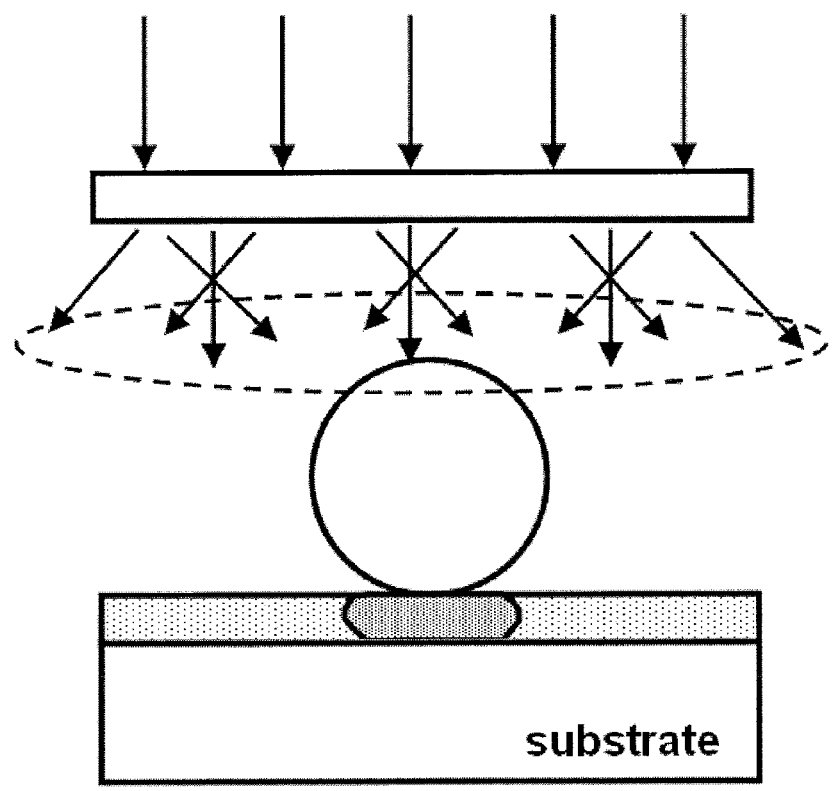
FIG. 5 illustrates illuminated light diffused in a specific direction.
Figure 6:
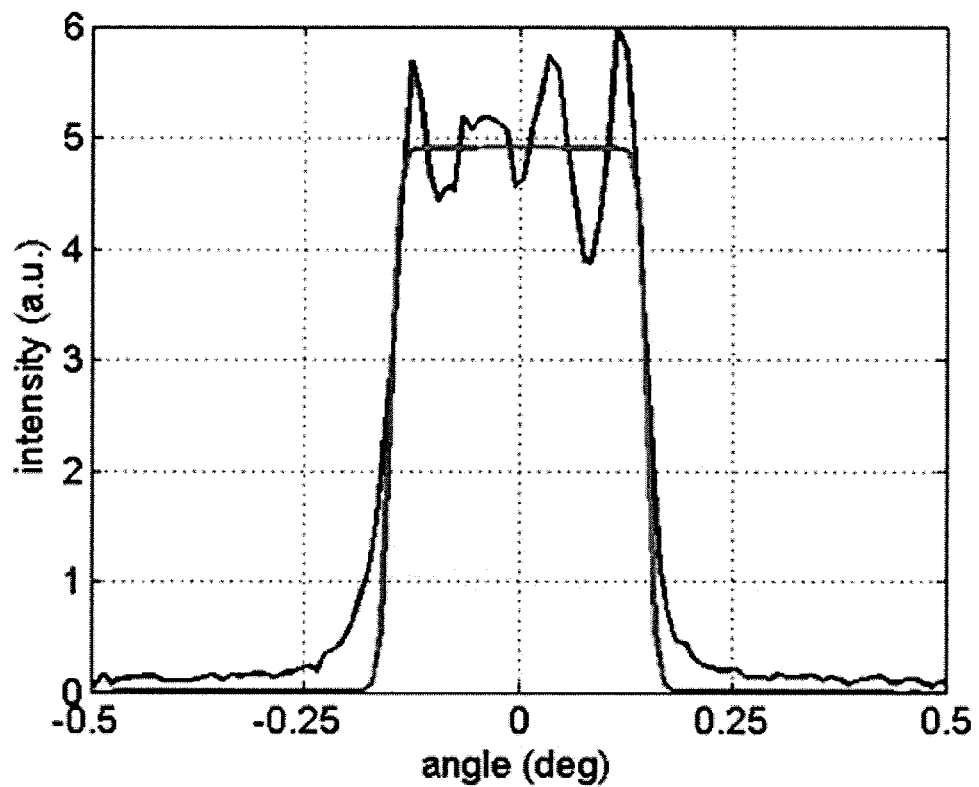
FIG. 6 is a graph showing intensity distribution of light passed through an Engineered Diffuser™ as a function of a direction (angle)
Figure 7:
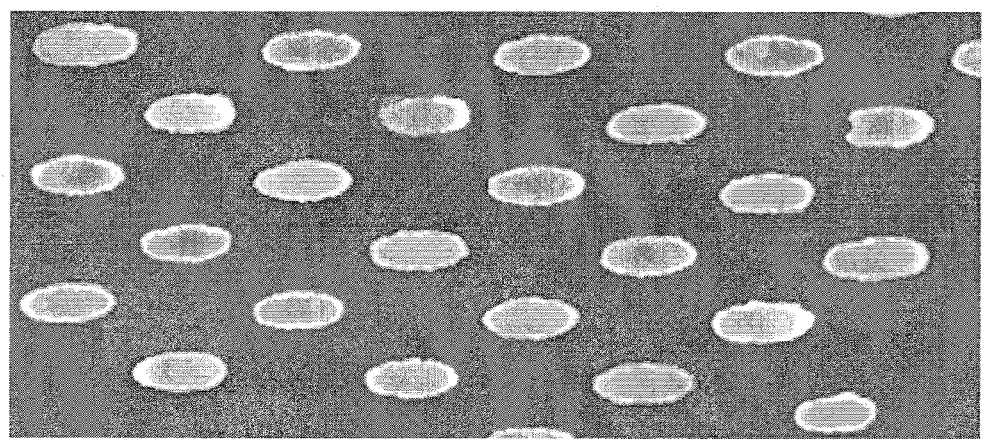
FIG. 7 is a scanning electron microscope (SEM) image of an array of ellipsoidal nanostructures patterned by light diffused in a specific direction.

As illustrated in FIG. 5, light illuminated to the focusing layer may be directionally scattered by a diffuser. In particular, as illustrated in FIG. 6, light passed through a linear Engineered Diffuser™ is one-dimensionally diffused with a predetermined angular divergence, and keeps collimation relatively in the orthogonal direction. The linearly diffused light passes through the focusing layer and then forms an anisotropic spot pattern on the interface with the resist layer underneath, so that the nanostructures with ellipsoidal shape can be fabricated thereafter as shown in FIG. 7. The aspect ratio of ellipsoidal nanostructures can be easily tuned depending on the divergence angle and the intensity distribution of the linear diffuser used. The modified nanosphere lithography using an Engineered Diffuser™ presented in an exemplary embodiment of the present invention provides a very simple process of fabricating anisotropic nanostructures even using spherical focusing beads as they are and has advantages in precise control of orientation and shape of nanostructures.

Anisotropic nanostructures have great potential in many applications. For example, nanostructures made of a noble metal such as gold or silver excites so-called localized surface plasmons (LSPs). Here, in comparison with a spherical nanostructure, ellipsoidal one exhibits a plasmonic resonance in the long-wavelength region, enhances light absorption and scattering efficiencies, and greatly improves its sensitivity responding to a change in local environment, which has attracted great concern for its use to biochemical sensors. Besides, the ellipsoidal nanostructures are advantageous for applications to light-emitting devices, photo-detectors, and solar cells due to the effect of local electric field enhancement. The shape of nanostructures implemented in an exemplary embodiment of the present invention is determined according to the characteristic of Engineered Diffuser™ used, and can be controlled to various shapes different from a linear structure as illustrated in FIG. 6.

Figure 8:
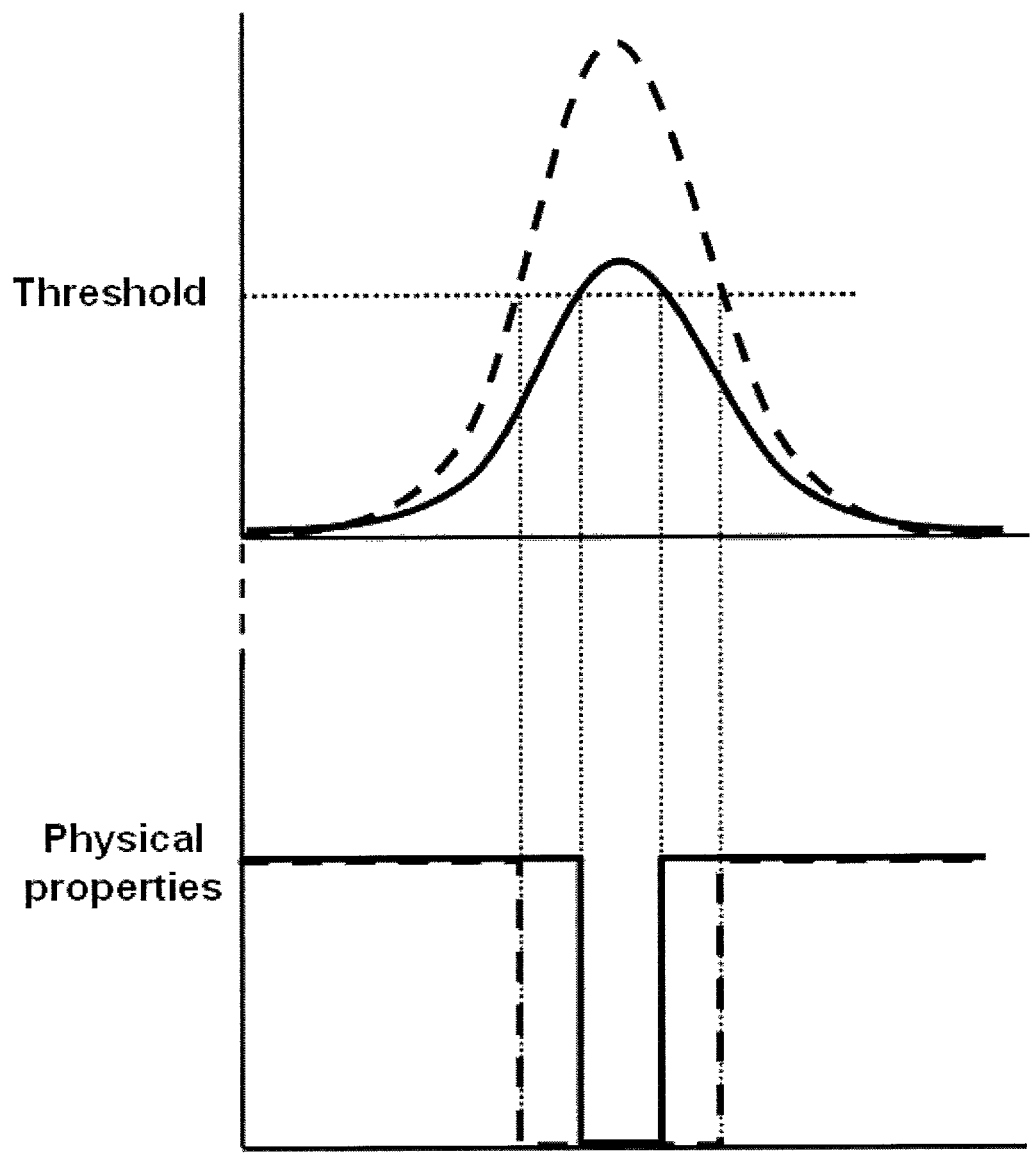
FIG. 8 is a graph showing the feature of a pattern varying depending on a threshold of thermal resist and irradiation dose.

Patterning mechanism of the resist layer caused by the concentrated energy through the focusing layer depends on the resist material used. The resist material may be both of the PR sensitized by the light itself and the thermal resist undergoing a phase-change by the heat generated from light absorption. As illustrated in FIG. 8, thermal resist is a material that has a certain energy level for initiating the phase change, that is, a threshold, and has a physical property remarkably changing at the energy level. Examples of thermal resist may be $Ta_2O_5$, Ge—Sb—Te, and ZnS—$SiO_2$. In addition, FIG. 8 shows how the pattern size changes depending on the irradiated dose when thermal resist is used. In this way, the pattern size can be precisely controlled using thermal resist.

Figure 9A:
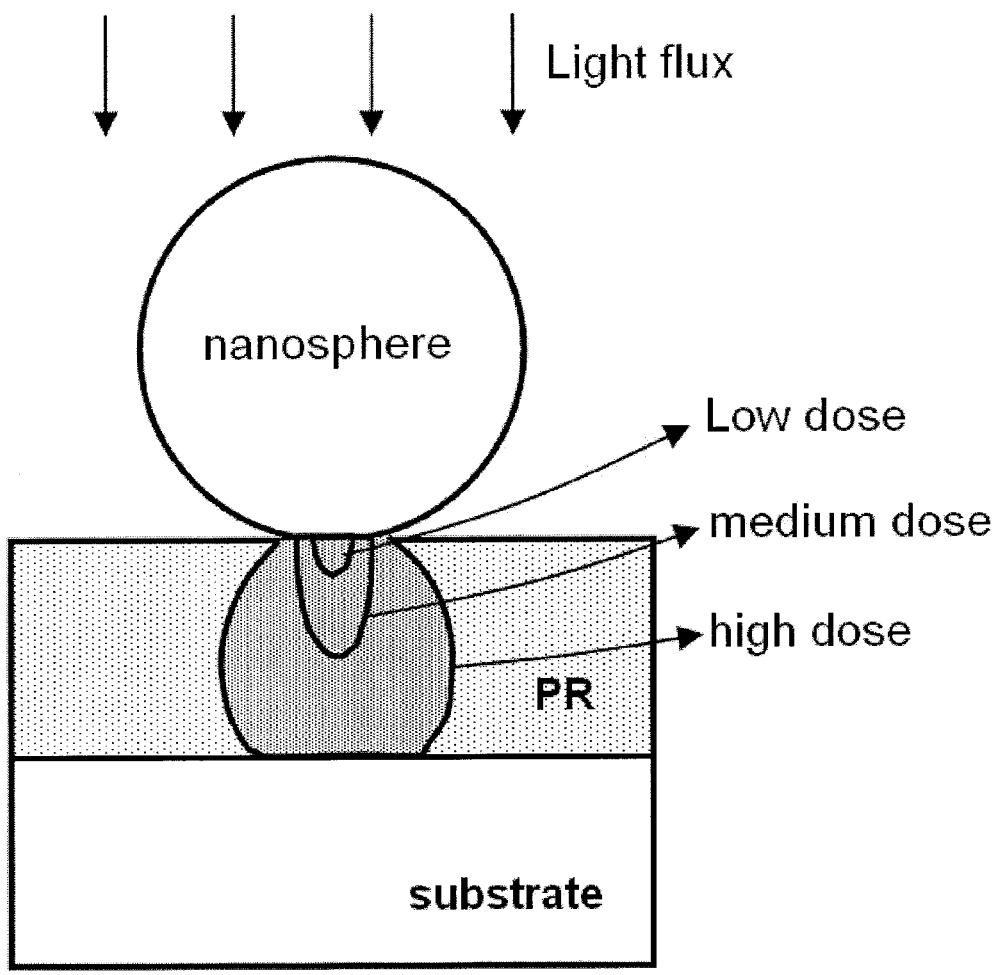
FIG. 9A illustrates an opening of a resist layer and a depth of a pattern generated depending on the irradiated dose when colloidal beads are used as a focusing layer.
Figure 9B:
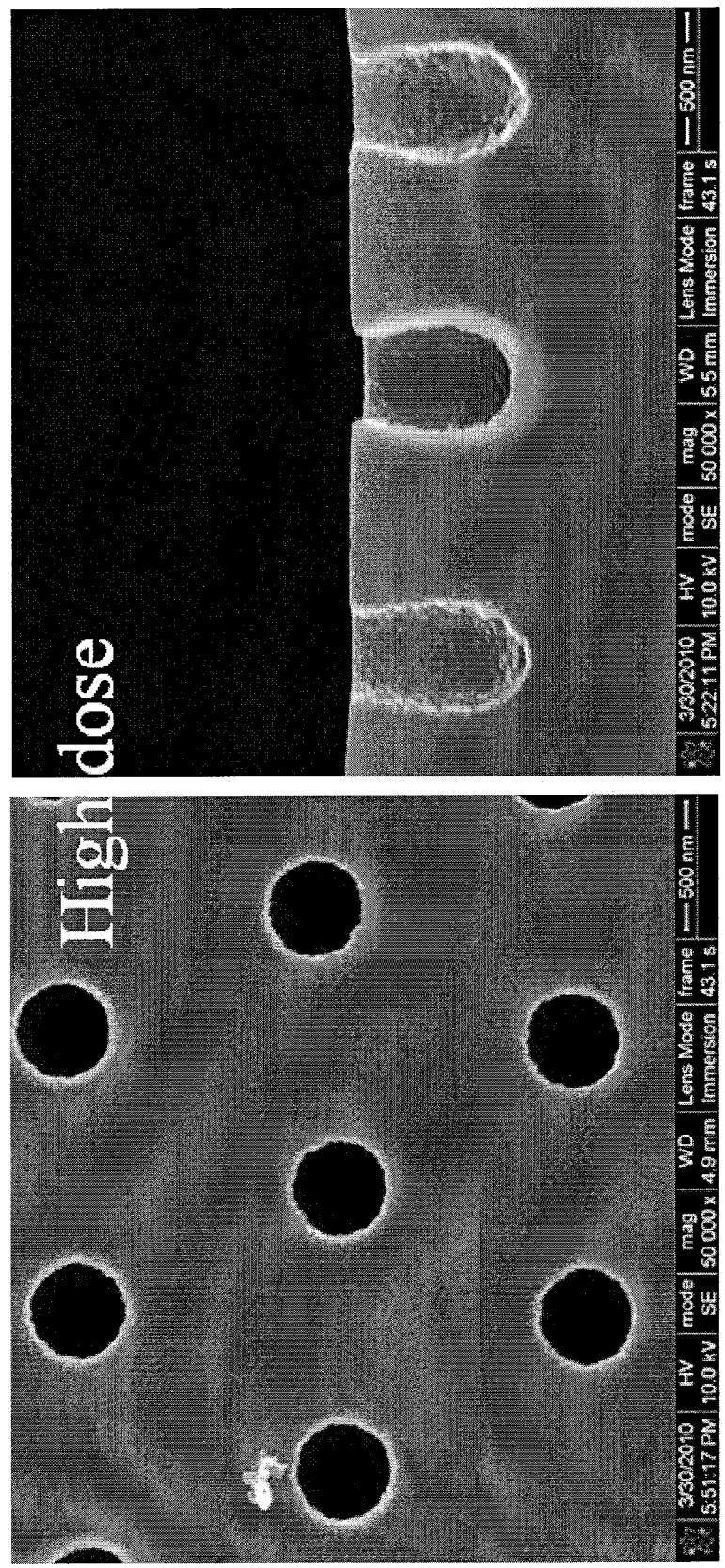
FIG. 9B shows plan-view and cross-sectional SEM images of a resist layer patterned by a high dose of light.
Figure 9C:
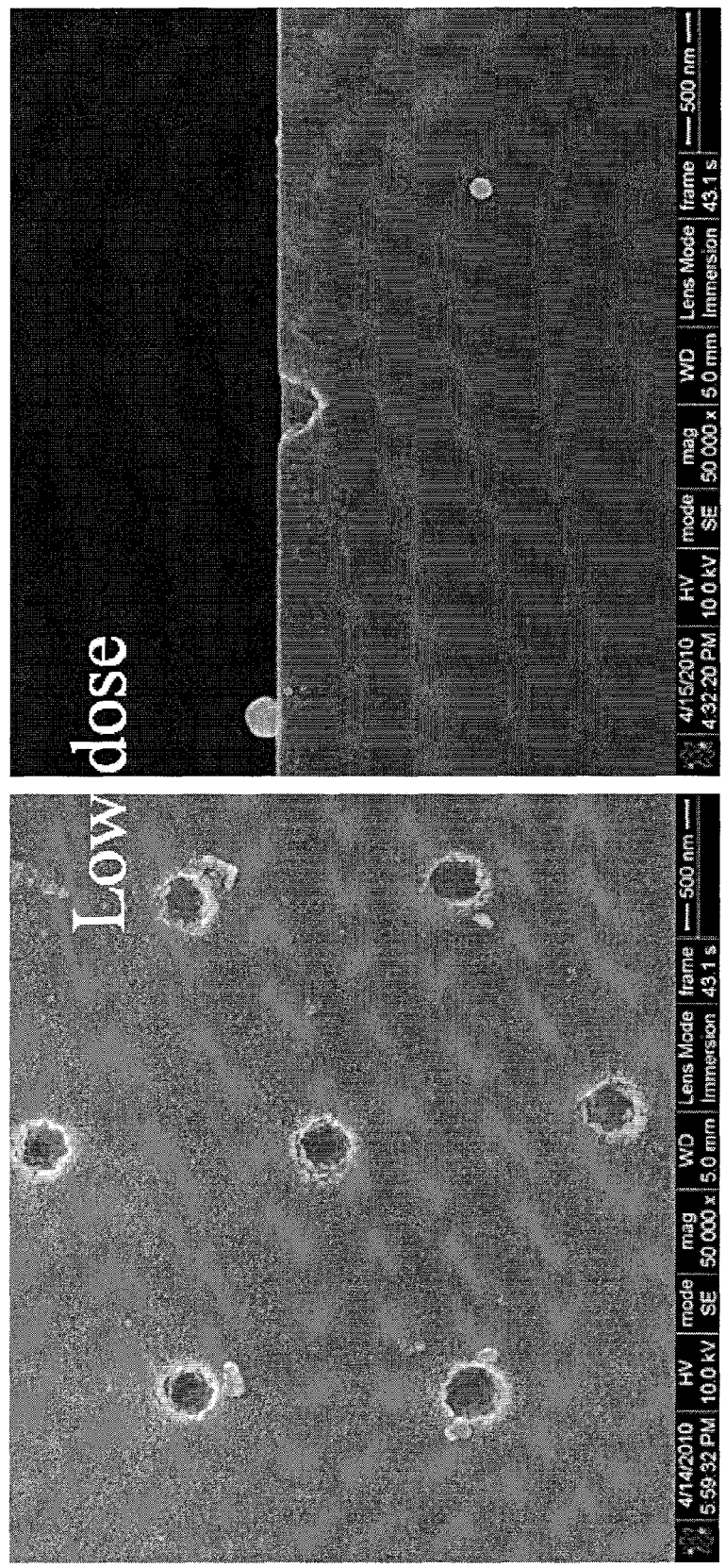
FIG. 9C shows plan-view and cross-sectional SEM images of a resist layer patterned by a low dose of light.
Figure 10:
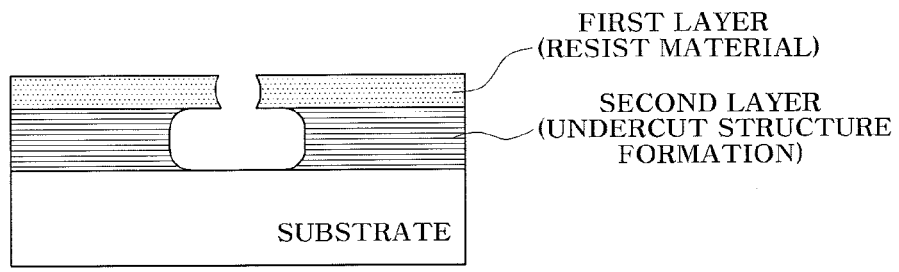
FIG. 10 is a cross-sectional view of a dual-layer resist layer patterned.

As illustrated in FIG. 9A, a pore formed by light illuminated at the resist layer has a size and depth varying according to the amount of the illuminated light. In other words, the pore-opening size and the pore depth are small at a low dose, while at a high dose, the pore-opening size becomes large and a sufficiently large undercut structure is generated under the opening. FIG. 9B shows the plan-view and cross-sectional scanning electron microscope (SEM) images of a resist layer patterned by a high dose of light. The large undercut structure generated in the resist layer is suitable for a process of depositing a material constituting a nanostructure and then removing the PR layer to finally form the nanostructure array (e.g., a lift-off process). However, the increase in the pore-opening size accompanies a problem that the size of nanostructures finally generated increases as well. On the other hand, as shown in FIG. 9C, the opening size is small at a low dose, favorable for the formation of small nanostructures. However, the pore depth is too shallow to be processed for a subsequent lift-off process. Thus, an exemplary embodiment of the present invention provides a dual-layer resist layer including a first layer in which a nanoscale pore is formed by the illuminated light on the resist layer, and a second undercut-forming layer by which an undercut structure connected to a lower portion of the pore is created as shown in FIG. 10.

To this end, the first layer includes a resist material (a resist material layer), and the second layer includes an ultraviolet (UV)-insensitive material that can be etched with most standard developers. Thus, once a pore-opening is created only throughout the first layer by light exposure or induced phase-change, then an undercut structure is formed in the underlying layer (an undercut-forming layer) connected to the opening during the process of developing the resist material. In this way, it is possible to remove the burden to form the undercut structure with only the resist material. Rather, the focused light only expose the resist material layer to make a through hole opening in the layer, whereby the size of nanostructure is determined, and the undercut structure is generated in the subsequent developing process, so that the patterning the resist layer to have a small opening size and a sufficient undercut structure is accomplished. Using the resist layer patterned this way, the formation process of nanostructure becomes more stable, and the edge profile of the fabricated nanostructure is also improved.

In other words, by separately patterning a pore-forming layer whereby the size of a nanostructure is determined, and an undercut-forming layer wherein an undercut structure preferred for a lift-off process is formed, the process efficiency for nano-patterning is improved.

Figure 11:
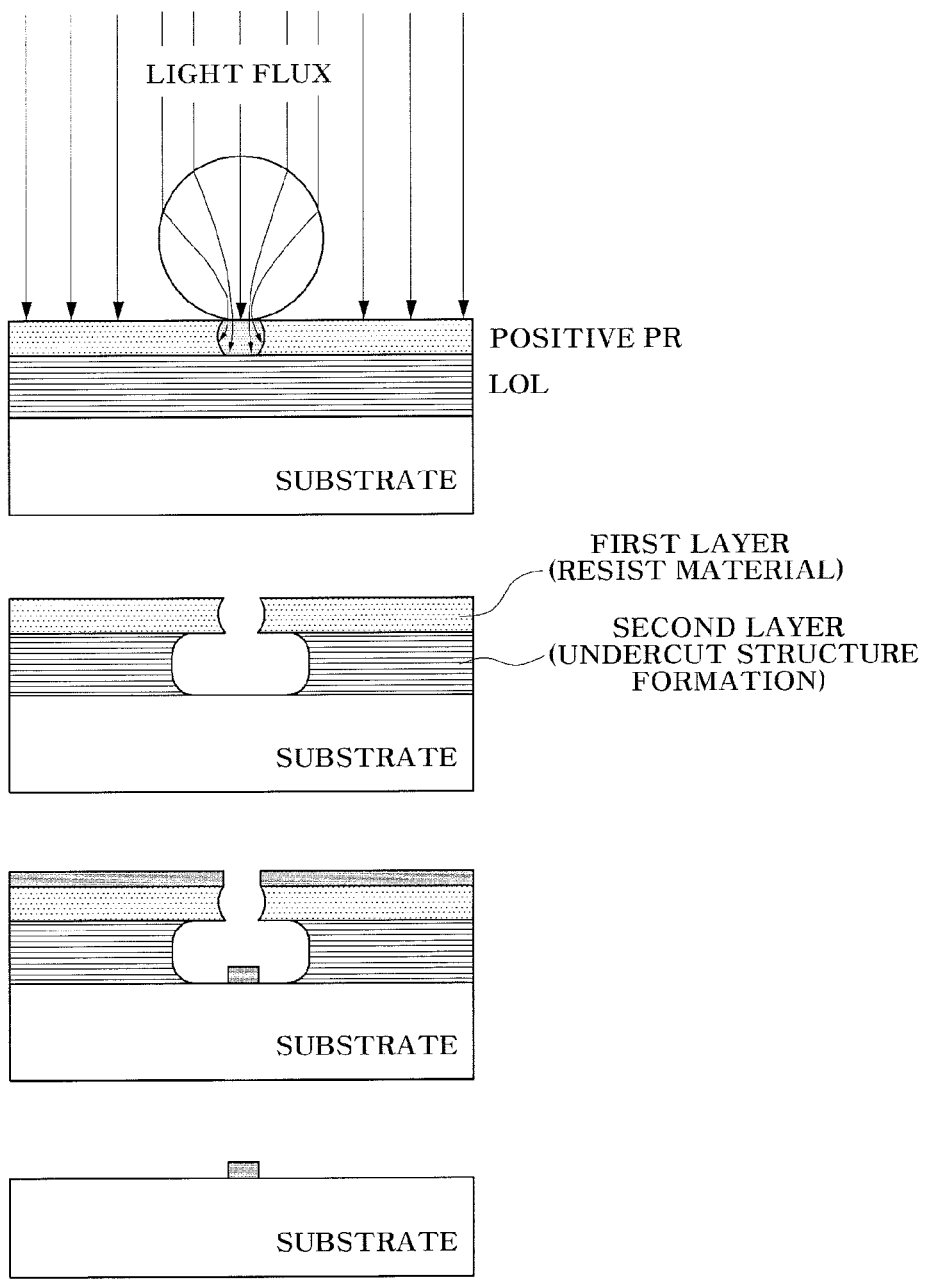
FIGS. 11 and 12 illustrate a process of forming a nanostructure using a dual-layer resist layer.

FIG. 11 illustrates a process of forming a nanostructure using a dual-layer resist layer when beads are used as the focusing layer. It can be seen from FIG. 11 that the size of a nanostructure is determined by the size of pore formed in PR, and the formation of a nanostructure becomes more stable due to the presence of the undercut structure.

Figure 12:
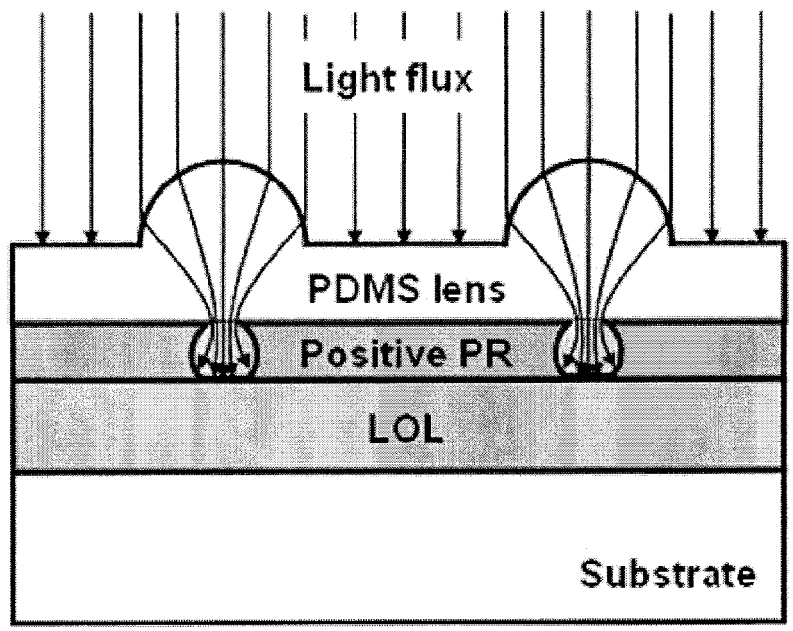
Figure 12:
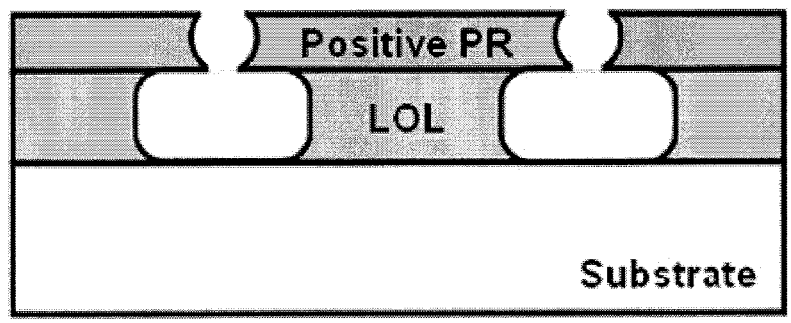
Figure 12:
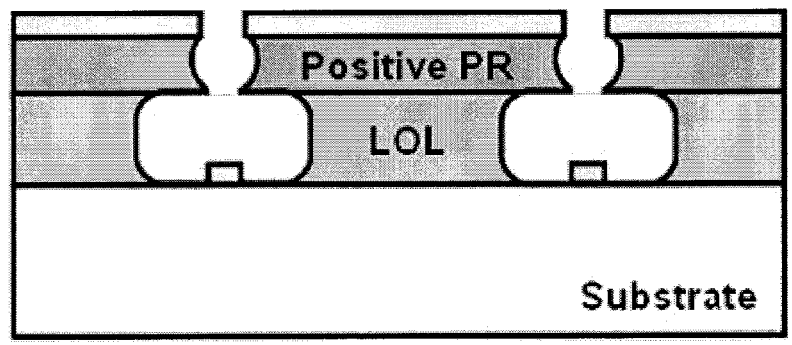
Figure 12:

FIG. 12 illustrates a process of forming a nanostructure using a dual-layer resist layer when lenses are used as the focusing layer.

Figure 13:
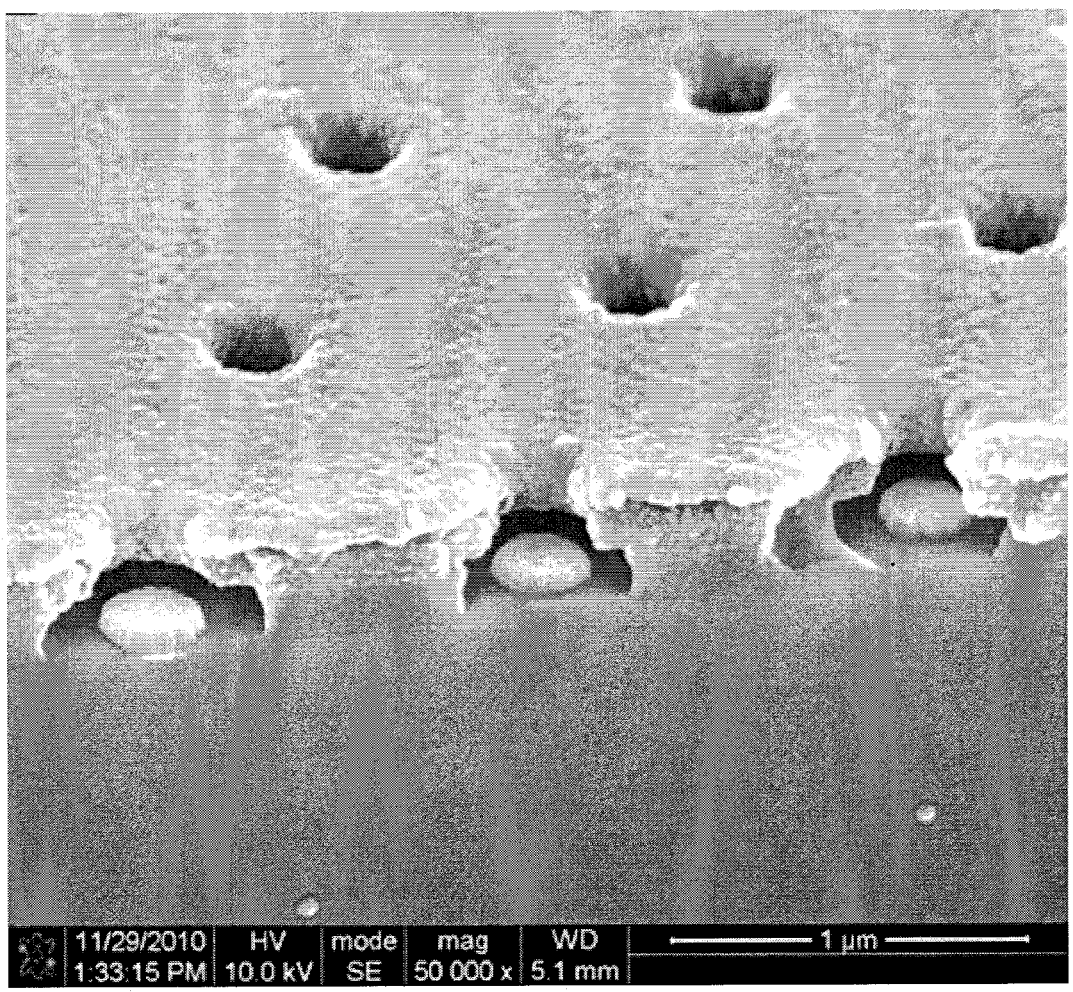
FIG. 13 shows an SEM image of nanostructures formed using a dual-layer resist layer patterned.

FIG. 13 shows a cross-sectional SEM image taken after a nanostructure material is deposited on the patterned resist layer. Small pores are formed to penetrate a resist material layer and undercut structures are generated to have enough spaces under the pores. Thereby, it is observed that the disc-type nanostructures having the same size as the pores are well fabricated on a substrate.

For the deposition of materials constituting the nanostructures, metals, semiconductors, or insulating materials are deposited on a pre-patterned resist layer by physical vapor deposition (PVD) or chemical vapor deposition (CVD). Finally, the resist layer is removed to complete the array of nanostructures. At this time, removal of the resist layer is performed using a cleaning solution that is generally used in a lift-off process and an ultrasonic treatment can be added.

A nanostructure array fabricated according to an exemplary embodiment of the present invention can be used in various types of devices. For example, the nanostructure array facilitates the formation of an anti-reflection coating layer having a moth eye structure and thus can contribute to efficiency improvement of solar cells and photodetectors. A structure of periodic array for photonic crystals can be applied to various optical communication devices, and enhances the efficiency of vertical light extraction when applied to a light-emitting diode (LED), etc. In addition to these, the structure can be applied to electronic/optical memory devices, photocatalysts, surface-enhanced Raman scattering substrates, all kinds of opto-electronic devices using the effect of local light-field enhancement, nanofilters, and fuel cells.

More preferably, a nanostructure array fabricated according to an exemplary embodiment of the present invention can be applied to a sensor. In particular, an exemplary embodiment of the present invention provides a method of diversely adjusting the size and shape of nanostructures constituting an array and the distance between the nanostructures, and thus the nanostructure array fabricated according to an exemplary embodiment of the present invention can be applied to fabricating the highly sensitive and reliable sensors optimized for the environment to be used.

Exemplary embodiments of the present invention will be described in detail below. However, it is to be understood that the exemplary embodiments merely facilitate understanding of the present invention, and the present invention is not limited thereto.

Exemplary Embodiment 1

To fabricate a metal nanostructure according to an exemplary embodiment of the present invention, a dual-layer resist layer consisting of an undercut-forming layer (a lift-off layer, LOL) and a thin positive PR layer (a PR layer) was spin-coated on a silicon substrate (STC). As the undercut-forming layer, LOL™2000 (Shipley Co.) that is insensitive to UV and etched with most standard developers was selected. When spun with a speed of 7000 rpm for 60 seconds, the LOL layer had a thickness of 150 nm and was baked at 170° C. for 5 minutes. A thickness of the PR overlayer deposited on the undercut-forming layer needs to be reduced for a lift-off process as long as a UV photosensitivity does not severely deteriorate. In this exemplary embodiment, AZ1500 thinner was mixed with PR AZ5214E at a ratio of 4:1, and spin-coated at 7000 rpm for 60 seconds to obtain the thickness of 150 nm. After this, the dual-layer resist was baked using a hot plate at 90° C. for 90 seconds. A polystyrene beads array used as a focusing layer was formed on the dual-layer resist layer by drop coating self-assembly method. The diameter of polystyrene beads (Polyscience Inc.) used was 1 μ. The next exposure process was carried out varying the exposure time from 2 to 20 seconds with the intensity of light illuminated to the resist layer reduced enough by inserting a neutral density (ND) filter having an optical density of 1 to prevent unnecessary PR exposure in a non-focused area. A wavelength of an exposure (Suss MicroTec, MA6) was 405 nm.

After polystyrene beads were removed from the exposed sample by ultrasonic cleaning, a developing process was carried out using a developer AZ300 MIF. After this, a 5-nm Ti adhesion layer and 50-nm Au thin film were sequentially deposited on the patterned resist layer by e-beam evaporation. Then, the final lift-off process was completed by immersing the sample in acetone for 5 minutes to remove the PR layer and in a developer AZ300 MIF for about one day to remove the LOL layer.

Figure 14:
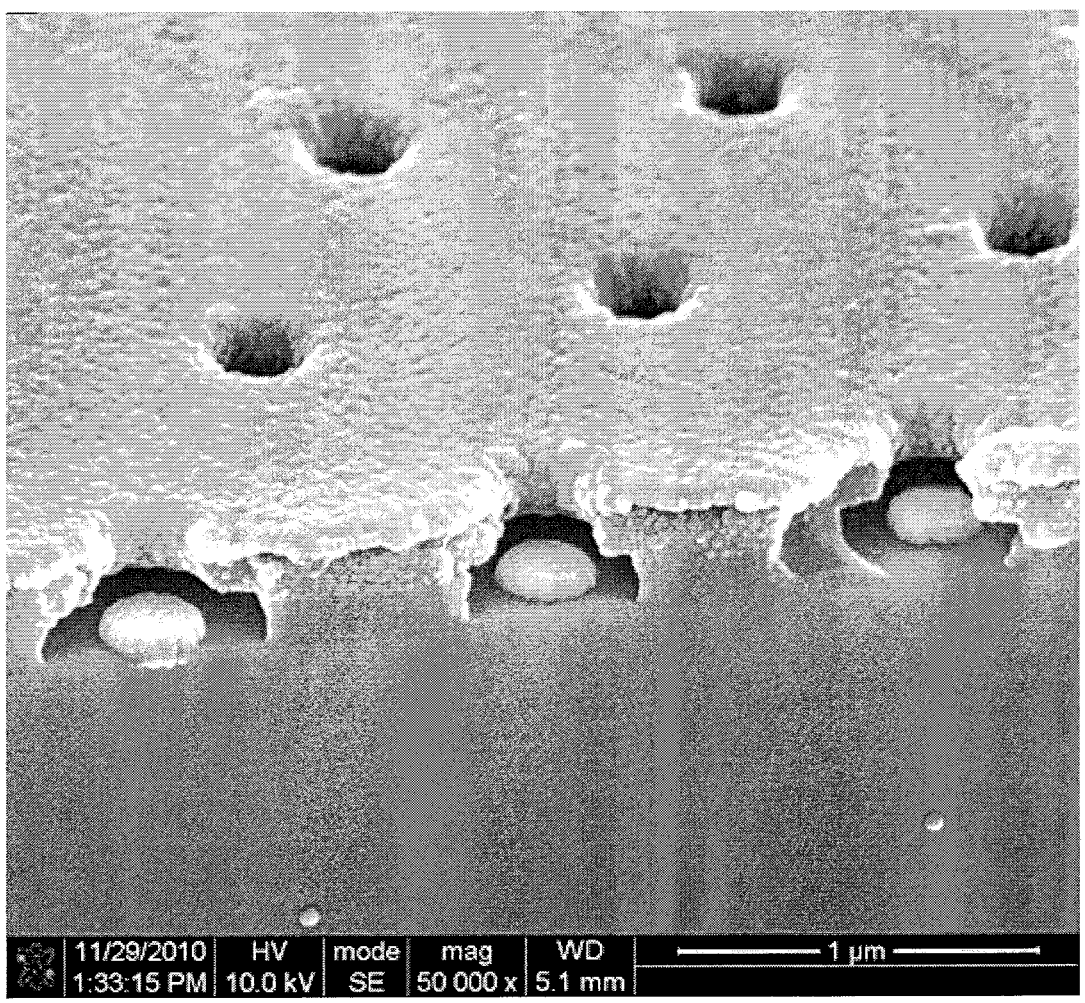
FIG. 14 shows an SEM image of gold nanostructures formed according to a first exemplary embodiment.

FIG. 14 shows a cross-sectional SEM image taken after Au film was deposited on a resist layer patterned with an exposure time of 4 seconds. It is possible to observe pores penetrating through a PR layer, and undercut structures in a UV-insensitive polymer layer connected to a lower portion of the pores. Also, it is possible to confirm that disc-type gold nanostructures are well fabricated on a substrate.

Figure 15A:
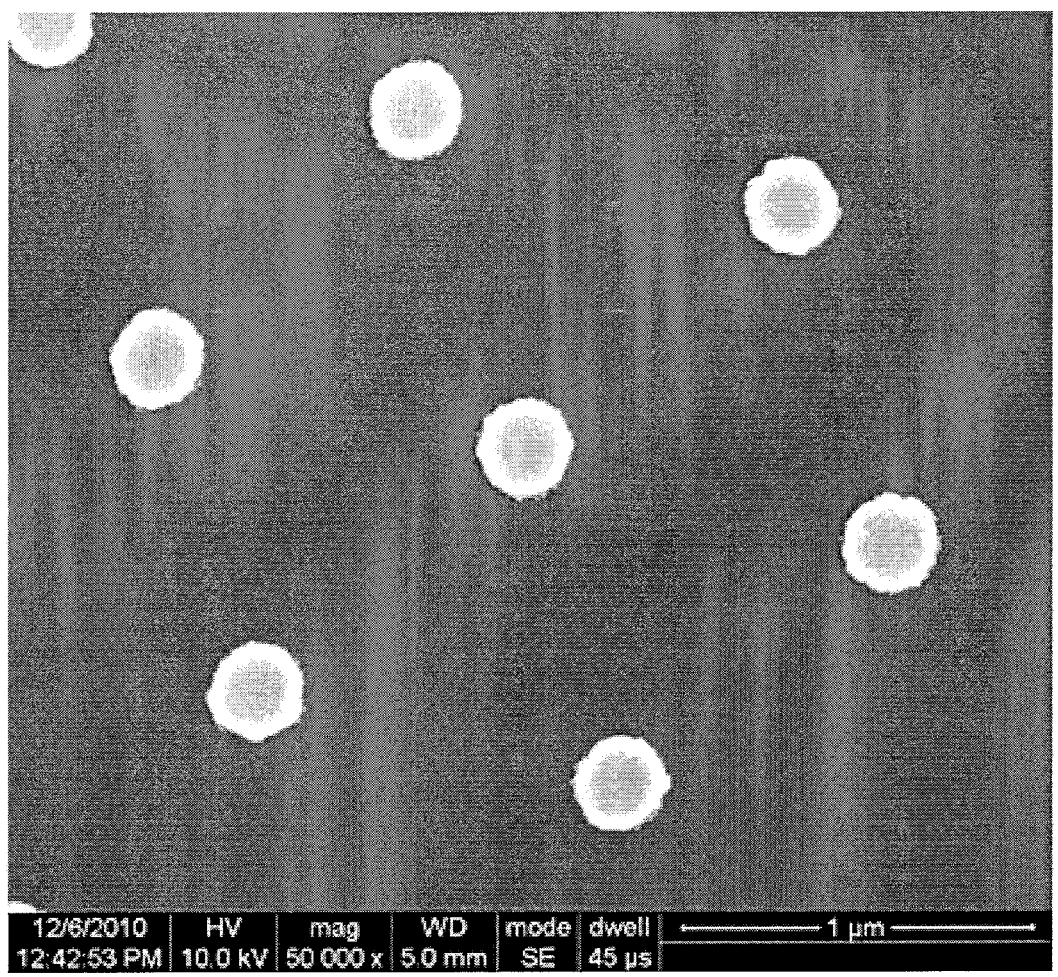
FIG. 15A shows an SEM image of a gold nanostructure array fabricated with an exposure time of 5 seconds according to the first exemplary embodiment.
Figure 15B:
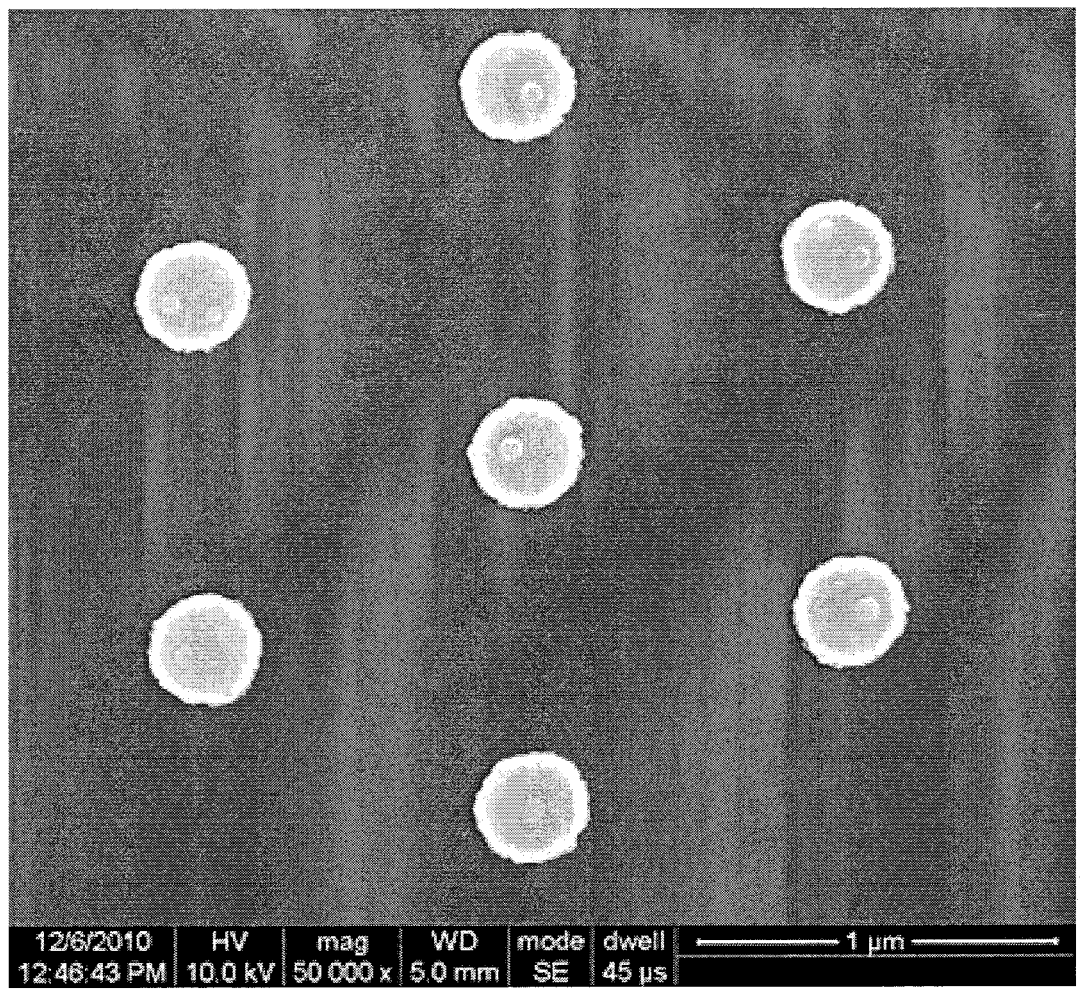
FIG. 15B shows an SEM image of a gold nanostructure array fabricated with an exposure time of 10 seconds according to the first exemplary embodiment.
Figure 15C:
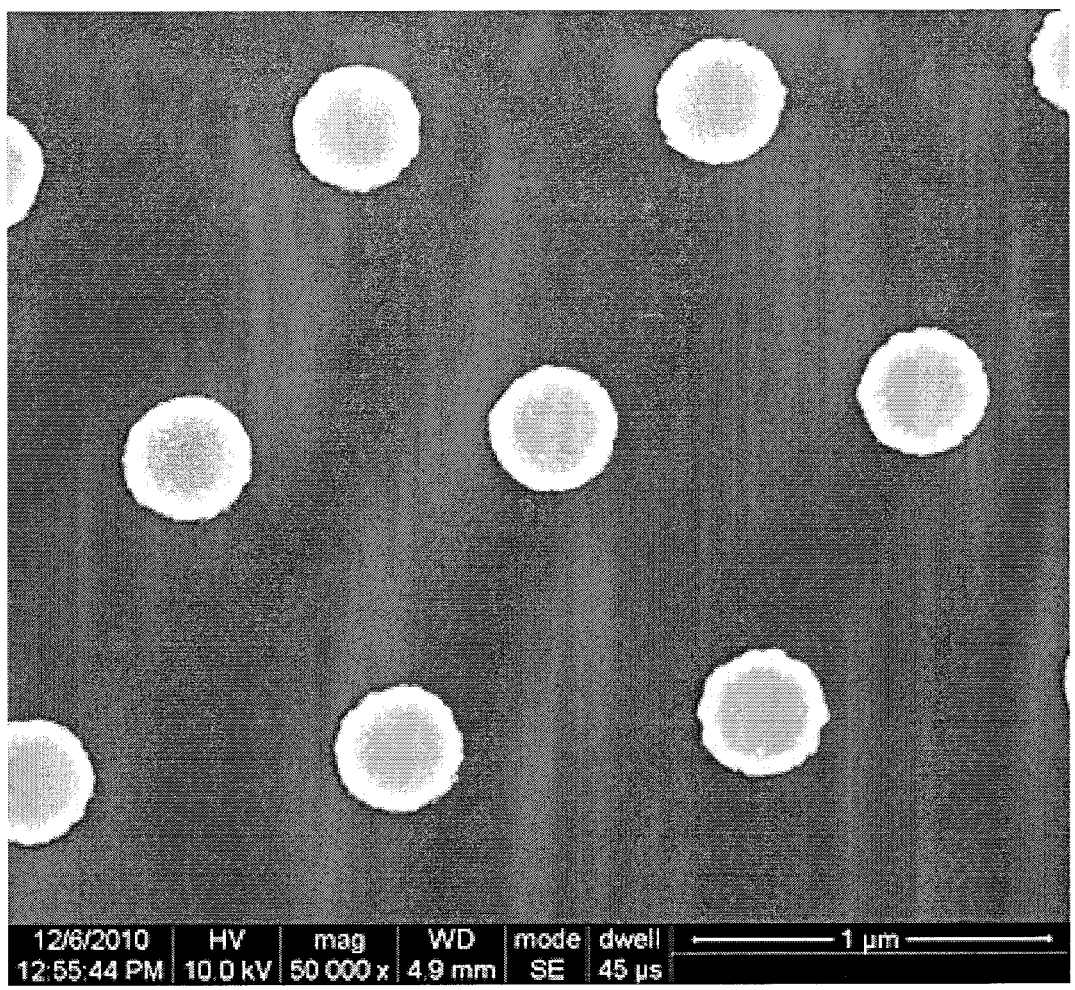
FIG. 15C shows an SEM image of a gold nanostructure array fabricated with an exposure time of 20 seconds according to the first exemplary embodiment.

FIGS. 15A, 15B, and 15C show images of disc-type gold nanostructures fabricated on a silicon substrate when the exposure time of illuminated light was controlled to be 5, 10 and 20 seconds, respectively. The higher an exposure dose, the larger the size of the discs became. This is because the size of pores formed in the PR layer increases with an increase in exposure dose and directly determines the size of nanostructures.

Figure 16:
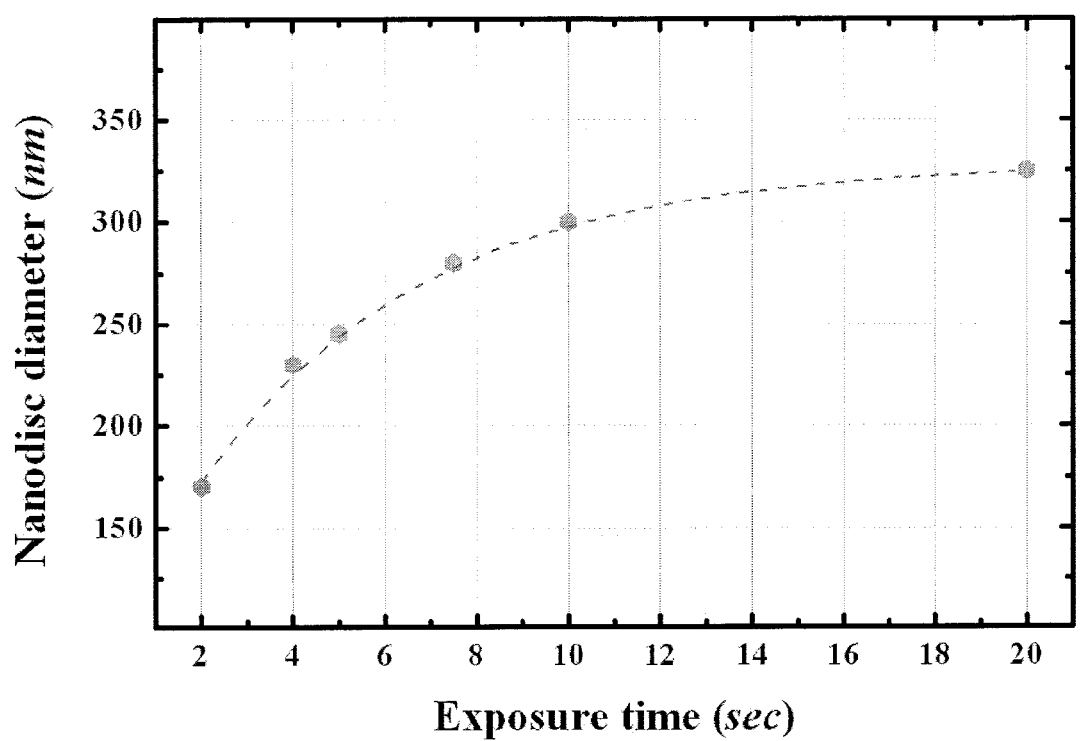
FIG. 16 is a graph showing the size of gold nanostructures fabricated depending on exposure time in the first exemplary embodiment.

FIG. 16 is a graph of diameter of a nanodisc versus exposure time. It can be seen that the diameter of the disc increases with light exposure time and becomes saturated above 300 nm. When a patterning process including an exposure condition is precisely adjusted, even patterning of 100-nm scale or less is enabled.

Exemplary Embodiment 2

A nanostructure array was fabricated in the same way as Exemplary Embodiment 1 except that a microlens array was used as the focusing layer.

Figure 17:
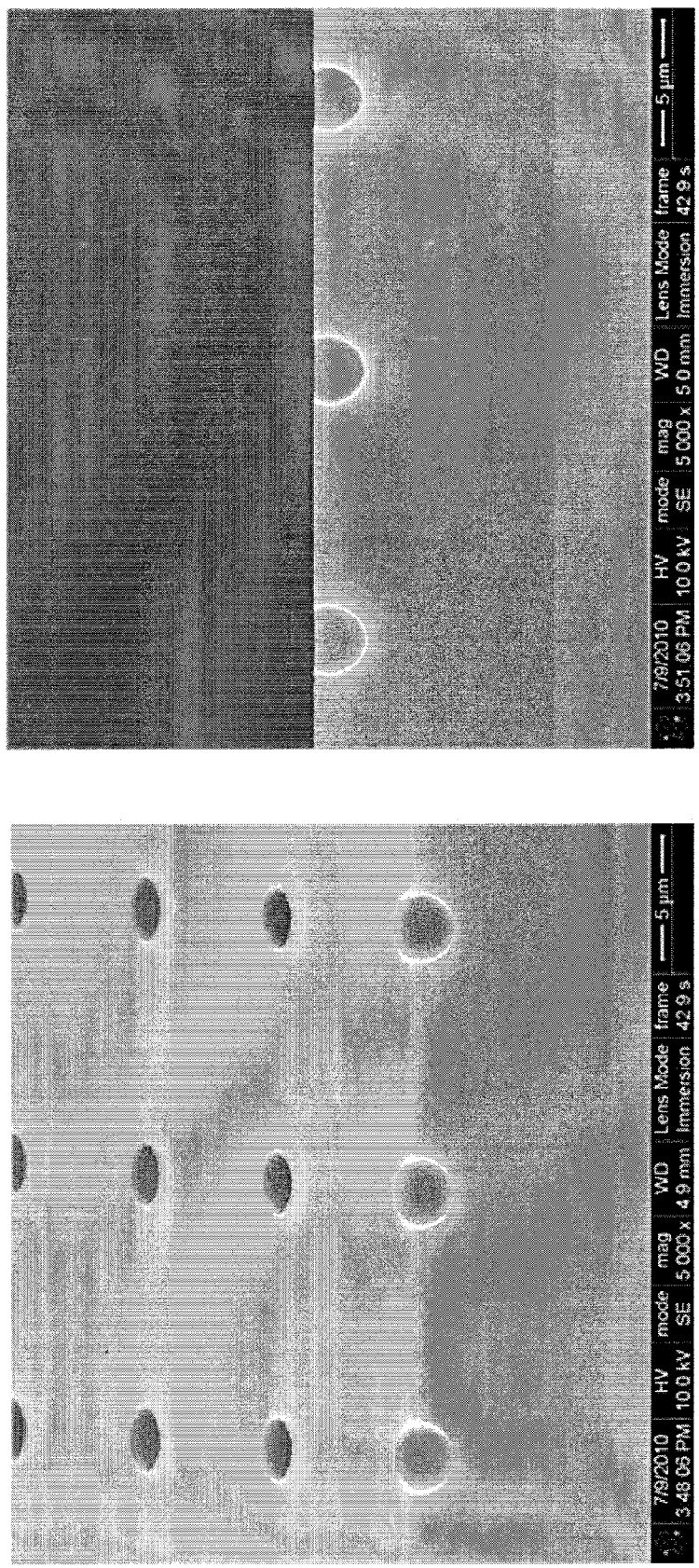
FIG. 17 shows an SEM image of a photoresist (PR) mold for fabricating a lens array according to a second exemplary embodiment.
Figure 18:
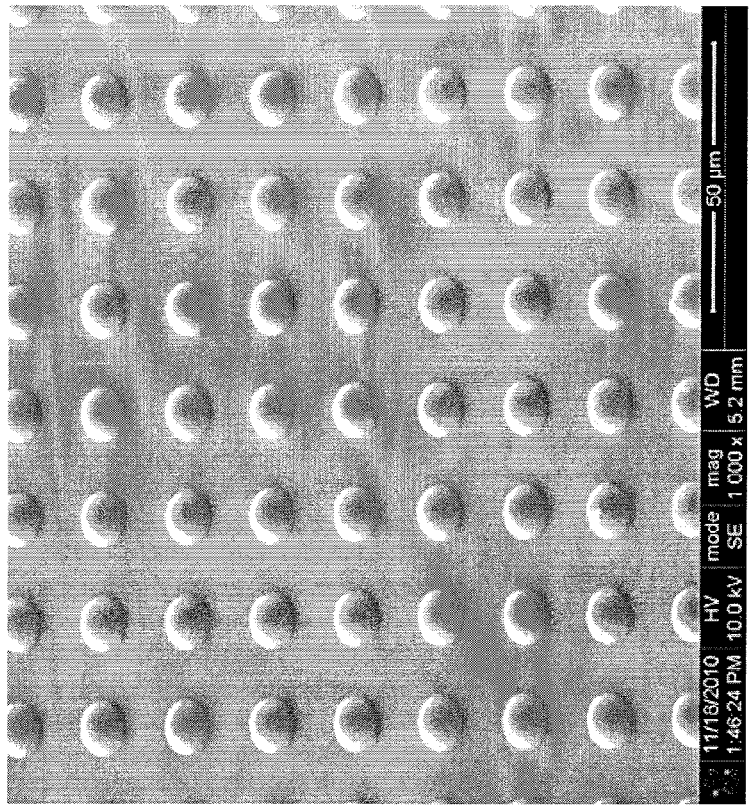
FIG. 18 shows an SEM image of a polydimethylsiloxane (PDMS) lens array fabricated according to the second exemplary embodiment.
Figure 18:
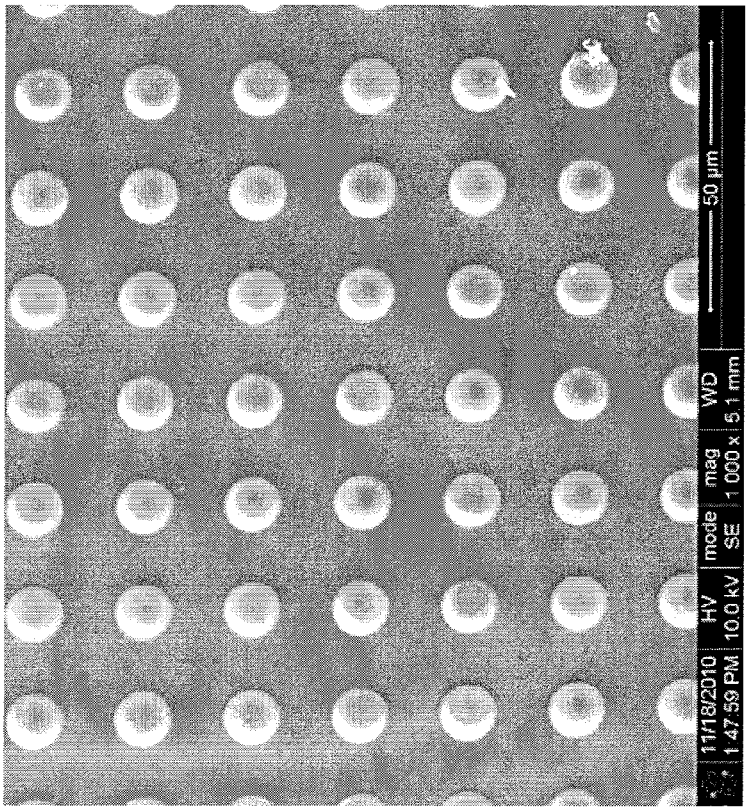

The lens array was fabricated by a three-dimensional (3D) diffuser photolithography and plastic replication method. FIG. 17 shows images of concave lens molds patterned in PR (AZ9260). The curvature of concave may be adjusted depending on the exposure dose to the PR. A liquid PDMS elastomer (Dow Corning, Sylgard 184) was spin-cast on the PR molds at various rpms to fabricate a thin microlens array film as shown in FIG. 18. The fabricated lens array film was carefully attached to a dual-layer resist layer and then exposed to UV. Through-holes in a thin resist material layer were formed and large-enough undercut structures were generated under the holes. Then, the patterned resist layer was used for a general subsequent lift-off process and a nanostructure array was fabricated on a substrate.

Figure 19:
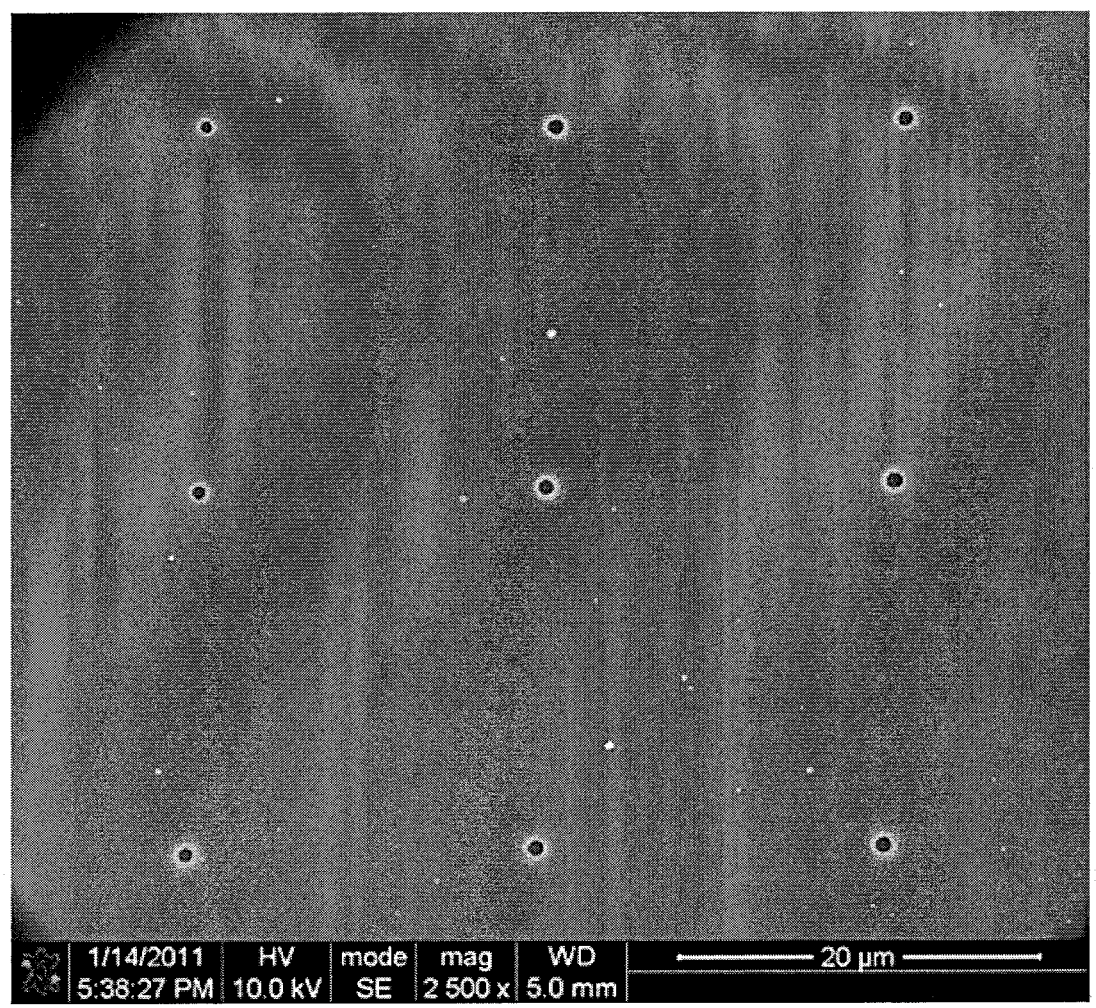
FIG. 19 shows an SEM image of a pore array patterned in a dual-layer resist layer according to the second exemplary embodiment.
Figure 20:
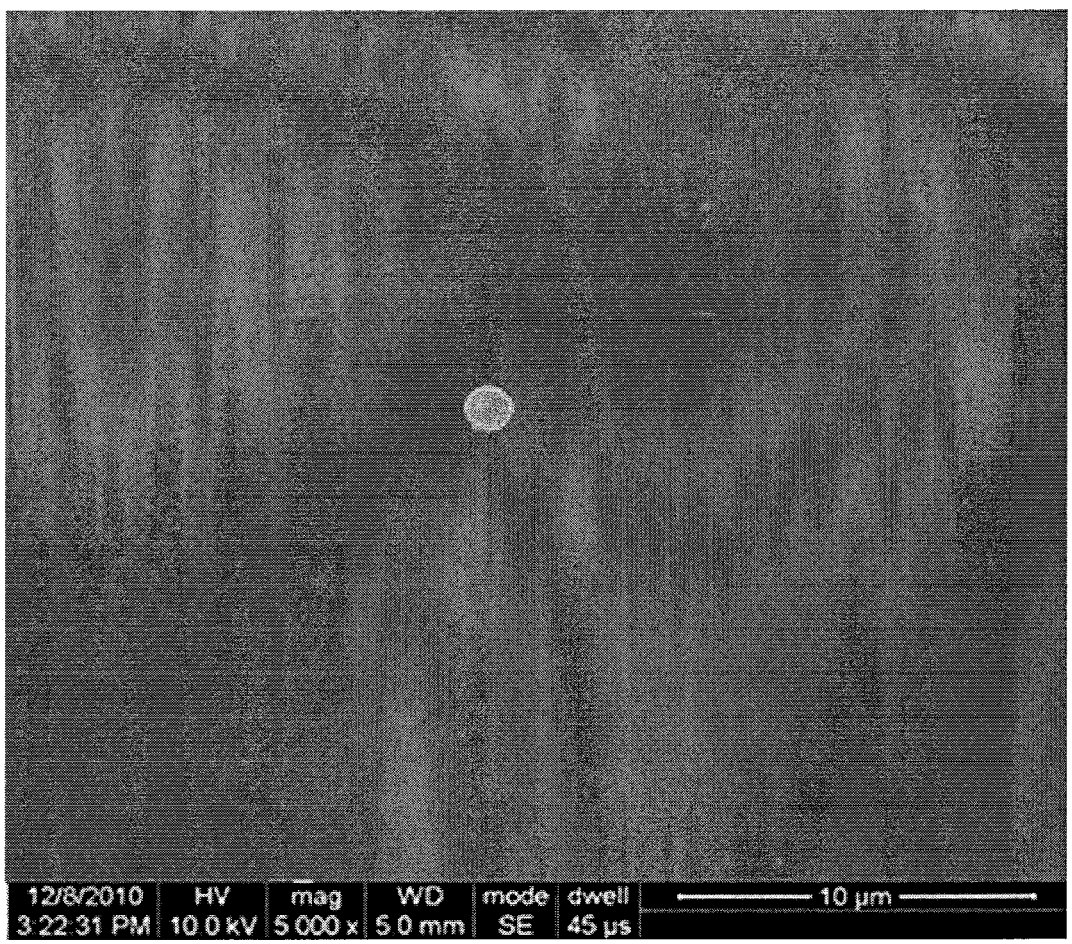
FIG. 20 shows an SEM image of a gold nanostructure formed according to the second exemplary embodiment.

FIG. 19 shows a SEM image of a pore array patterned in a dual-layer resist layer using a microlens array as the focusing layer. Also, FIG. 20 shows a SEM image of a disc-type gold nanostructure fabricated on a substrate.

In exemplary embodiments of the present invention, it is possible to readily and effectively adjust the size and shape of nanostructures constituting a nanostructure array and the interval between the nanostructures.

Thus, the exemplary embodiments of the present invention can improve performance of a device including the nanostructure array.

In particular, a sensor including a nanostructure array according to an exemplary embodiment of the present invention has improved sensitivity and reliability optimized for an environment and purpose to be used.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended

What is claimed is:

1. A method of fabricating a nanostructure array, comprising:

illuminating light onto a laminated structure which comprises a substrate, a resist layer and a focusing layer stacked together in sequence, so that the light is focused while passing through the focusing layer, causing the resist layer to be sensitized by the focused light at an interface of the resist layer so that the resist layer is patterned; and depositing, through openings in the patterned resist layer onto the substrate, a material to form the nanostructure array on the substrate, wherein the light illuminated is scattered at a specific divergence angle and thereby the resist layer is patterned in anisotropic spots and the nanostructure is formed in anisotropic shape, and anisotropicity of the nanostructure is varied by varying the divergence angle of the light illuminated.

2. The method of claim 1, wherein the resist layer has a resist material layer in which a nanoscale pore is formed, and an undercut-forming layer by which an undercut structure connected to a lower portion of the pore is created.

3. The method of claim 1, wherein the focusing layer is an array of beads focusing the light.

4. The method of claim 3, wherein the array of beads is formed by self-assembly.

5. The method of claim 3, wherein the array of beads has a shape modified by physical, chemical and thermal processes.

6. The method of claim 1, wherein the focusing layer is a film containing an array of beads focusing the light.

7. The method of claim 1, wherein the focusing layer is an array of lenses focusing the light.

8. The method of claim 7, wherein the array of lenses includes a lens array unit and a plate under the lens array unit.

9. The method of claim 2, wherein the resist material layer includes a material exhibiting a phase-change by the light passed through the focusing layer.

10. The method of claim 1, wherein the material for constituting the nanostructure array is a metal, semiconductor, or insulating material.

* * * * *